(12) United States Patent
Nightingale et al.

(10) Patent No.: US 7,979,822 B2
(45) Date of Patent: Jul. 12, 2011

(54) APPARATUS AND METHOD FOR PERFORMING A SEQUENCE OF VERIFICATION TESTS TO VERIFY A DESIGN OF A DATA PROCESSING SYSTEM

(75) Inventors: Andrew Mark Nightingale, Cambridge (GB); Louise Margaret Jameson, Cambridge (GB)

(73) Assignee: ARM Limited, Cambridge (GB)

( * ) Notice: Subject to any disclaimer, the term of this patent is extended or adjusted under 35 U.S.C. 154(b) by 447 days.

(21) Appl. No.: 12/155,337

(22) Filed: Jun. 3, 2008

(65) Prior Publication Data

US 2008/0313587 A1 Dec. 18, 2008

(30) Foreign Application Priority Data

Jun. 13, 2007 (GB) .................................. 0711453.1

(51) Int. Cl.
*G06F 17/50* (2006.01)
(52) U.S. Cl. ........................................................ 716/106
(58) Field of Classification Search ............... 716/5, 106
See application file for complete search history.

(56) References Cited

U.S. PATENT DOCUMENTS

| | | | |
|---|---|---|---|
| 6,272,668 B1 | 8/2001 | Teene | |
| 6,463,488 B1 | 10/2002 | San Juan | |
| 7,055,113 B2 * | 5/2006 | Broberg et al. | 716/1 |
| 7,246,333 B2 * | 7/2007 | Bingham | 716/4 |
| 7,418,681 B2 * | 8/2008 | Takei | 716/5 |
| 2003/0225565 A1 * | 12/2003 | Garcia et al. | 703/23 |

FOREIGN PATENT DOCUMENTS

WO 2006/037374 4/2006

OTHER PUBLICATIONS

Search Report for GB0711453.1 dated Oct. 5, 2007.
de Moura et al., "Integrating Verification Components", *Computer Science Laboratory*, pp. 1-9.
Barnett et al., "Spying on Components: A Runtime Verification Technique", *Microsoft Research*, pp. 1-7.

* cited by examiner

*Primary Examiner* — Jack Chiang
*Assistant Examiner* — Brandon W Bowers
(74) *Attorney, Agent, or Firm* — Nixon & Vanderhye P.C.

(57) ABSTRACT

An apparatus and method are provided for performing a sequence of verification tests to verify the design of a data processing system. The apparatus comprises a system under verification representing the design of the data processing system, the system under verification including a component model representing at least one hardware component of the data processing system. The component model includes an interface module through which the component model interacts with other portions of the system under verification during performance of the verification tests. An alternative model is provided for representing the hardware component for selected verification tests, and the interface module comprises a verification interface module which is responsive to switch criteria specified by the alternative model to switch in the alternative model in place of the component model. Accordingly, by such an approach, the alternative model can take the place of the component model during performance of the selected verification tests. This maintains system integrity of the system under verification, whilst providing a simple and effective mechanism for enabling the alternative model to take the place of the component model for certain specific verification tests, for example when testing corner cases in the design.

18 Claims, 6 Drawing Sheets

FIG. 6

APPARATUS AND METHOD FOR PERFORMING A SEQUENCE OF VERIFICATION TESTS TO VERIFY A DESIGN OF A DATA PROCESSING SYSTEM

TECHNICAL FIELD

The technical field relates to an apparatus and method for performing a sequence of verification tests to verify a design of a data processing system.

BACKGROUND

The ability to effectively and efficiently test and/or validate designs is becoming increasingly important. Typical data processing system designs are rapidly increasing in complexity and furthermore are including circuit blocks designed by a variety of different sources or companies. So called system-on-chip (SoC) designs that integrate a large number of functional elements on a single integrated circuit have strong advantages in terms of cost and performance, but require significant amounts of validation and testing before the designs can be reliably released for manufacture. This validation and testing requirement is becoming a bottleneck in getting new systems into the market place. Consequently, measures that can improve the efficiency and effectiveness of such validation and testing of designs are strongly advantageous.

One known approach that can be used to seek to validate a SoC design is to construct a system under verification representing the design of the data processing system to be tested, where the system under verification includes a number of models modelling particular parts of the system design. The system under verification may include a component model representing one or more hardware components of the data processing system, and this component model may be coupled via an interface module with other portions of the system under verification.

Sequences of verification tests can then be performed upon the system under verification to cause various transactions to take place between different portions of the system in order to test correct operation, each transaction defining one or more transfers between specified portions of the system. However, it can be difficult to efficiently verify corner cases (i.e. problems or situations that occur only outside of normal operating parameters) in a system design purely by performing sequences of transactions within the system under verification. Accordingly, it is known to seek to verify corner cases by substituting one or more component models with transactors, a transactor being a simplified model which can be viewed externally as modelling the same hardware component(s) as the component model which it is substituted for, but which internally is significantly simplified, and designed specifically to perform one or more test actions which can be provided to seek to test and verify corner cases in the system design.

One example of such a transactor is an eXtensible Verification Component (XVC) which can be arranged to execute certain test scenarios. Often a number of XVCs may be substituted into the design, with the actions of the separate XVCs being coordinated by a test manager. The test actions performed by the XVCs can take a variety of forms, and hence for example considering an XVC used to represent a master device, that XVC may perform test actions to either drive directed FRBM (File Reader BUS Master) format vectors onto an associated bus, or to generate random patterns of transfers constrained by a user configuration file. FRBM is an ARM Limited proprietary format used to stimulate AMBA bus signals, for example AHB, APB or AXI, in order to perform read and write transfers on a bus interconnect.

Transactors such as the above XVC components can often provide a more direct route to exercising design corner cases than would be the case if instead a particular component model is used, and this can enable verification closure to be completed more efficiently. However, one disadvantage of such an approach is that system integrity is potentially compromised at each stage of the verification process due to the absence of the actual component models that have been substituted. In particular, due to the substitution of a component model with such a transactor, the revised system under verification then less precisely models the actual design of the data processing system seeking to be verified. Another disadvantage is that it is often very time consuming for a verification engineer to produce a set of test vectors to be executed by the transactor to place the system into a given state ready for testing.

The article "Integrating Verification Components" by Leonardo de Moura et al, Computer Science Laboratory, SRI International, appearing on the Internet at http://vstte.ethz.ch/Files/demoura-owre-ruess-rushby-shankar.pdf, discusses the merits of directly connected or embedded verification components. Verification components replace system components for DUT (Device under Test) testing, and are analogous to the ARM XVC methodology discussed earlier.

The article "Spying on Components: A Runtime Verification Technique", by Mike Barneff et al, Microsoft Research, appearing on the Internet at http://research.microsoft.com/users/schulte/Papers/SpyingOnComponents(savcbs2001).pdf, discusses the use of runtime monitors to check the specification of a component.

The CADI interface developed by ARM Limited, Cambridge, United Kingdom, in connection with its RealView SoC Designer product provides an interface to a model that allows a debugger to access the internal state of the model and perform memory access to the rest of the system. These memory accesses should not change the internal state of the system e.g. cache state, cycle count, or bus state. However a write access to memory or an internal register will change the state of that memory location or register.

In the field of testing designs at an RTL (Register Transfer Language) level, ARM Limited developed a RealView modelling environment which included a test interface controller (TIC). The TIC can be used as a bus master in a system in order to inject test vectors, and hence is essentially a verification component that connects to the system bus and is controlled via an external control mechanism outside of the system under test. Further discussion of the TIC module can be found in commonly assigned U.S. Pat. No. 6,463,488.

It would be desirable to provide an improved technique for verifying a design of a data processing system which enables effective testing of corner cases whilst alleviating impact on system integrity whilst performing such testing.

SUMMARY

Viewed from a first aspect, the technology described in this application provides an apparatus for performing a sequence of verification tests to verify a design of a data processing system, the apparatus comprising: a system under verification representing the design of the data processing system, the system under verification including a component model representing at least one hardware component of the data processing system, the component model including an interface module through which the component model interacts with other portions of the system under verification during performance of the verification tests; an alternative model for representing the hardware component for selected verification tests; the interface module comprising a verification interface module which is responsive to switch criteria specified by the alternative model to switch in the alternative model in place of the component model, such that the alternative model takes the place of the component model during performance of the selected verification tests.

The interface module of a component model in the system under verification is provided with a verification interface module which allows an alternative model to take the place of the component model for certain selected verification tests. In particular, the verification interface module is responsive to switch criteria specified by the alternative model to switch in that alternative model in place of the component model, thereby allowing the alternative model to be used for certain selected verification tests. Hence, the original component models for the system under verification can remain in place whilst verification tests are being conducted, whilst allowing an alternative model to be switched in for certain selected verification tests.

Hence, by way of example, such an approach allows the normal operation of the system under verification to proceed until a trigger condition specified by the switch criteria is met, at which point the alternative model can then be switched in, for example to allow that alternative model to take control of the simulation for certain selected verification tests. This approach provides an efficient mechanism for allowing a particular model to be inserted to enable particular directed verification tests to be performed, for example those seeking to verify corner cases in the system design, whilst allowing the system under verification to remain unchanged for all other parts of the verification process, thereby improving system integrity.

The technique may be applied at various levels of modelling abstraction. However, in one embodiment, at least the component model of the system under verification is a cycle accurate model, and the switch criteria are timing dependent. The techniques of example embodiments allow corner cases to be efficiently verified in a system design at a cycle accurate model level of abstraction in a non-intrusive way.

In one embodiment, the alternative model is provided at the same level of abstraction as the component model, and accordingly in embodiments where the component model is a cycle accurate model, then the alternative model will also typically be a cycle accurate model, as this enables a cleaner switching between the component model and the alternative model via the verification interface module. This also enables the verification interface module to maintain transparency with respect to other portions of the system under verification, in that which of the component model or alternative model is operating at a particular point in time can be hidden from those other portions of the system under verification so that they are unaware of instances where the alternative model has taken over from the component model.

In one embodiment, all parts of the system under verification will be at the same level of abstraction, and accordingly in one embodiment all parts of the system under verification will be at a cycle accurate level of abstraction. However, this is not essential, and in alternative embodiments other parts of the system under verification may be at a lower level of abstraction, i.e. at a level closer to the final silicon implementation. Hence, considering the example where the component model and alternative model are at a cycle accurate level of abstraction, other parts of the system under verification may also be at the cycle accurate level, or some parts may be for example at an RTL level of abstraction, or an FPGA level of abstraction.

There are a number of ways in which the verification interface module can handle the switching from the component model to the alternative model, and vice versa. In one embodiment, the verification interface module is provided with local memory, on occurrence of the switch criteria the verification interface module awaiting completion of any current transaction involving the component model, and then saving interface configuration information of the interface module to the local memory prior to switching in the alternative model in place of the component model. By awaiting completion of any current transaction involving the component model, the switchover to the alternative model can be kept transparent from other portions of the system under verification, and indeed from the component model itself. In particular, when the current transaction has completed, the verification interface module may simply indicate to the component model that it is not available to receive a next transaction, at which point the component model merely waits, assuming other parts of the system under verification to be busy. The interface configuration information of the interface module is saved to local memory prior to the switch, so that that configuration can later be restored prior to switching back to the component model in due course. At that point, the component model can merely resume its activities, unaware of the intervention of the alternative model. As far as the other portions of the system under verification are concerned, they are unaware of the temporary intervention of the alternative model and any transactions issued by the alternative model appear to have been initiated by the component model.

In one embodiment, the verification interface module is further responsive to switch back criteria to await completion of any current transaction involving the alternative model, and then to reference the interface configuration information in the local memory in order to restore the interface module to its configuration that existed prior to the alternative model having being switched in, whereafter the component model is allowed to resume interacting with the other portions of the system under verification.

As mentioned above, this provides a seamless switch back to the component model. Optionally, any interface configuration information applicable to the alternative model can also be stored to local memory at this point, so that it can later be restored when the alternative model is next switched in again. This would maintain symmetry in respect of the actions undertaken by the verification interface module when switching in the alternative model, and when switching back to the component model.

The alternative model can take a variety of forms. However, in one embodiment the alternative model is a transactor for performing one or more test actions transferring at least one of one or more stimulus signals and one or more response signals between a portion of the system under verification and said transactor during performance of said selected verification tests. As mentioned previously, a transactor is a particularly useful tool for seeking to exercise corner cases, and indeed in one embodiment the selected verification tests are verification tests aimed at exercising corner cases in the system under verification.

The verification interface module can be arranged in a variety of ways. However, in one embodiment the verification interface module has a plurality of states of operation, and is responsive to one or more predetermined events to transition from a current state of operation to a next state of operation.

The predetermined events may take a variety of forms, and may for example include events such as reset events and the like, which may be arranged to cause the verification interface module to enter a predetermined state of operation, for example an idle state of operation. However, additionally, such predetermined events may include commands issued from the alternative model. For example, in one embodiment, one of the one or more predetermined events is receipt by the verification interface module of a state change command from the alternative model identifying the next state of operation.

The different states of operation may take a variety of forms. In one embodiment, one of the states of operation is an active driving state, when in the active driving state the verification interface module being responsive to occurrence of the switch criteria to switch in the alternative model in place of the component model. Hence, in such embodiments, by placing the verification interface module into the active driving state, the earlier-described switching functionality can be implemented to cause the alternative model to be switched in place of the component model upon occurrence of certain switch criteria.

In one embodiment, one of the states of operation is an active passive state, when in the active passive state the verification interface module being responsive to monitor criteria specified by the alternative model to monitor certain transactions occurring between the component model and the other portions of the system under verification via the interface module, and to send monitor data indicative of those transactions to the alternative model. Hence, in this mode of operation, the normal activities occurring between the component model and other portions of the system under verification are allowed to continue, and the alternative model receives from the verification interface module monitor data indicative of those activities.

Such monitor data can be used by the alternative model in a variety of ways. In one embodiment, the alternative model is arranged to store the monitor data to allow later replay of the monitored transactions by the alternative model when the verification interface module subsequently switches in the alternative model in place of the component model. This hence provides a simple and effective mechanism for programming up the alternative model so that it can emulate the behaviour of the component model up to a particular point of interest. Hence, this may be used to allow the alternative model to re-run a sequence of transactions in order to place the system under verification into a particular state ready for some additional selected verification tests to then be performed under the control of the alternative model.

Another use for the monitor data is to allow the alternative model to analyse the monitor data to seek to identify occurrence of one or more specific transaction activities, and hence by way of example to allow the alternative model to identify accesses to particular addresses, the use of particular data values, etc. Occurrences of such activities may then be used to cause the alternative model to take some additional actions, for example by causing the verification interface module to then enter the active driving state of operation so as to allow the alternative model to instigate some particular verification tests.

The various criteria referenced by the verification interface module during its operation may be predetermined or alternatively may be programmable. In one embodiment, the alternative model is arranged to issue a parameter update command to the verification interface module to alter parameters specifying criteria to be applied by the verification interface module either in its current state of operation or when the verification interface module has transitioned to said next state of operation.

The actual transition from the current state of operation to the next state of operation may be performed in a variety of ways. However, in one embodiment, the transition from the current state to the next state is performed via a handshake mechanism between the verification interface module and the alternative model. The use of such a handshake mechanism enables the operation of the alternative model to be synchronised with the system under verification at the time any particular state of operation of the verification interface module is entered, for example thereby allowing the alternative model to begin initiating transactions when the verification interface module has been placed in the active driving state, to enable the alternative model to prepare to receive monitor data when the verification interface module has been placed in the active passive state, etc.

Whilst in one embodiment the verification interface module is coupled to a single alternative model to be switched in in place of the associated component model, in alternative embodiments the apparatus may provide one or more further alternative models for representing the hardware component, each of those models being coupled to the verification interface module, and separate switch criteria being specifiable for each further alternative model. Hence, for example, each such alternative model may be responsible for driving a particular protocol interface/port of the component model, AXI being one such example. Typically, only one verification interface module is required regardless of the number of ports provided in respect of the component model. Such an approach reduces the overall complexity of the interface and incurs no simulation cycle overhead as access to different ports is requested over the interface.

Whilst in one embodiment the component model may represent a single hardware component of the data processing system, in alternative embodiments the component model may represent multiple hardware components forming a particular sub-system, and hence by way of example the component model may represent a plurality of hardware components interconnected by a bus infrastructure. The use of the active-passive state of operation in such embodiments provides a simple and effective mechanism for allowing the alternative model to be programmed up to emulate the behaviour of that component model up to a point in time where some particular corner case testing is required.

Viewed from a second aspect, the technology described in this application provides a method of performing a sequence of verification tests to verify a design of a data processing system, the method comprising the steps of: providing a system under verification representing the design of the data processing system, the system under verification including a component model representing at least one hardware component of the data processing system; providing within the component model an interface module through which the component model interacts with other portions of the system under verification during performance of the verification tests; providing an alternative model for representing the hardware component for selected verification tests; responsive to switch criteria specified by the alternative model, employing a verification interface module within the interface module to switch in the alternative model in place of the component model, such that the alternative model takes the place of the component model during performance of the selected verification tests.

Viewed from a third aspect, the technology described in this application provides a simulator tool for executing on a computer to perform a sequence of verification tests to verify a design of a data processing system, the simulator tool performing the steps of: providing a system under verification representing the design of the data processing system, the system under verification including a component model representing at least one hardware component of the data processing system; providing within the component model an interface module through which the component model interacts with other portions of the system under verification during performance of the verification tests; providing an alternative model for representing the hardware component for selected verification tests; responsive to switch criteria specified by the alternative model, employing a verification interface module within the interface module to switch in the alternative model in place of the component model, such that the alternative model takes the place of the component model during performance of the selected verification tests.

It will be appreciated that not all portions of the entire system under verification need to be provided within the same simulator tool, and instead the simulator tool may interface to other tools providing particular portions of the system under verification.

DESCRIPTION

Figure 1:
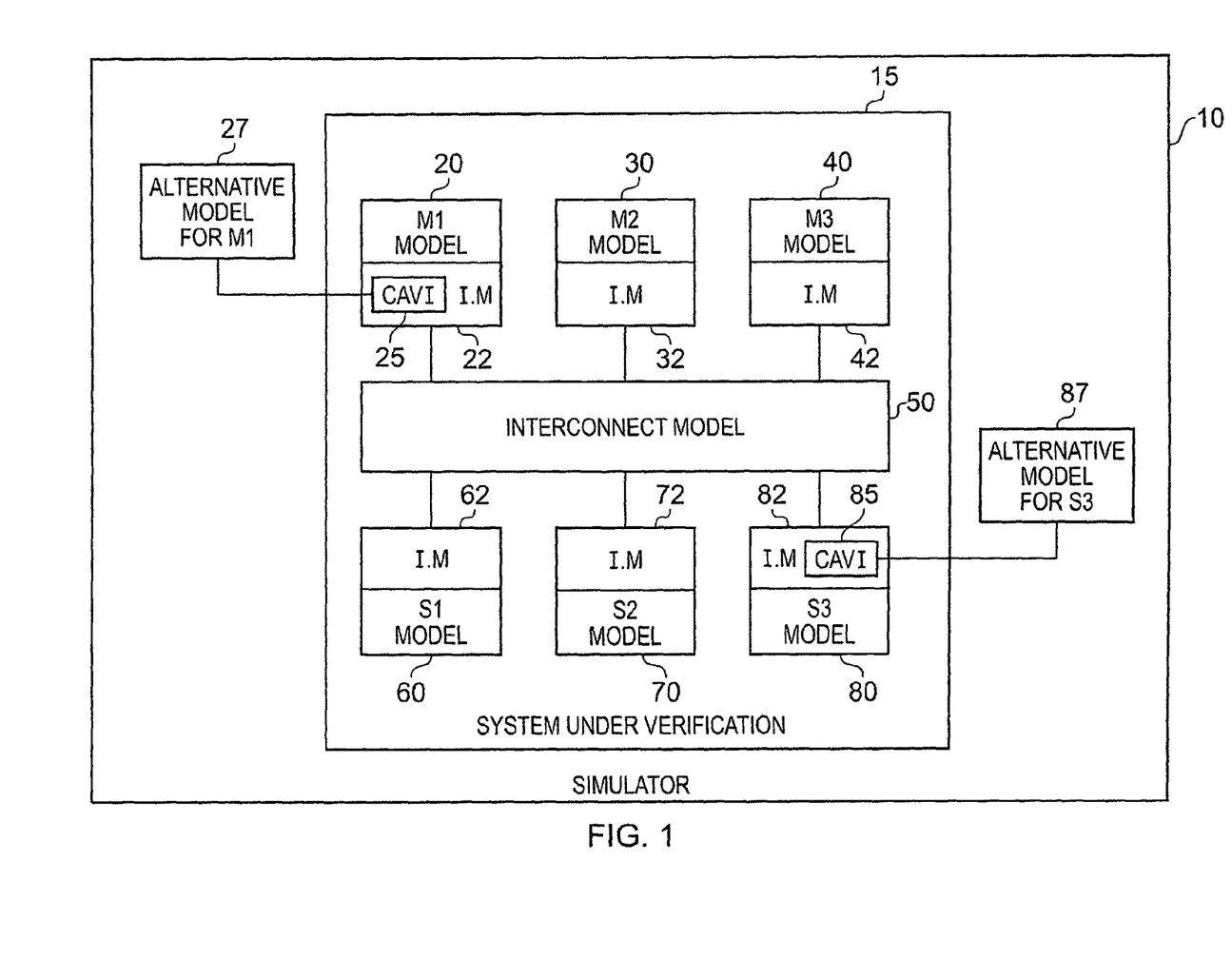
FIG. 1 is a diagram illustrating an apparatus in accordance with one non-limiting, example embodiment.

FIG. 1 is a block diagram illustrating an apparatus in accordance with one non-limiting, example embodiment. The apparatus 10 may take the form of a simulator executing on a computer to perform a sequence of verification tests to verify the design of a data processing system. In particular, the design of a data processing system is represented by a system under verification 15, and the system under verification can take a variety of forms. In the embodiment illustrated in FIG. 1, the data processing system whose design is being tested consists of a number of master devices coupled via a bus interconnect with a number of slave devices. In the example illustrated, each of these component parts of the data processing system are represented by a component model, and accordingly component models 20, 30, 40 are provided to model the three master devices within the data processing system design, and similarly three slave component models 60, 70, 80 are provided to model the three slave devices of the data processing system. Similarly, an interconnect model 50 is provided to model the functionality of the bus interconnect.

The level of abstraction at which the various models within the system under verification are provided can take a variety of forms. In one embodiment, all of the models 20, 30, 40, 50, 60, 70, 80 are provided at a cycle accurate level of abstraction and accordingly each model can simulate the behaviour of the component it represents at a clock cycle accuracy. However, it is not a requirement that all of the component parts of the system under verification are provided at the same level of abstraction, and in an alternative embodiment one or more of the components of the data processing system may be provided in a different modelling environment at a lower level of abstraction and then coupled to the simulator 10 illustrated in FIG. 1.

As shown in FIG. 1, each of the component models 20, 30, 40, 60, 70, 80 are provided with an interface module 22, 32, 42, 62, 72, 82, respectively through which that component model interacts with other portions of the system under verification during performance of the verification tests. In accordance with non-limiting, example embodiments, one or more of these interface modules may be provided with a verification interface module implemented as part of its class structure. For the purposes of describing an example embodiment, it is assumed that any interface modules provided with this verification interface module are part of a cycle accurate component model, and accordingly the verification interface module will be referred to hereafter as a cycle accurate verification interface (CAVI). In the particular example illustrated in FIG. 1, it can be seen that a CAVI 25, 85 is provided in association with the interface modules 22, 82 of the master 1 model 20 and the slave 3 model 80. As will be described in more detail later, each CAVI 25, 85 enables one or more alternative models to be coupled thereto, such that in response to switch criteria specified by the relevant alternative model, that alternative model can be switched in to the design in place of the relevant component model, such that the alternative model takes the place of that component model during performance of selected verification tests.

Hence, by way of example, the CAVI 25 will on occurrence of certain switch criteria specified by the alternative master 1 model 27 switch that alternative model in in place of the master 1 component model 20 so that that alternative model is then used for certain specified verification tests, for example a sequence of verification tests aimed at testing corner cases within the design.

Such an approach is not limited to models that represent the functionality of master devices, and similarly a CAVI 85 can be provided in association with a slave component model, in this example the slave 3 component model 80, in order to allow selective substitution of that model with an alternative slave model 87 upon occurrence of certain switch criteria.

In one non-limiting, example embodiment, the alternative model and the component model with which it is associated are provided at the same level of abstraction, as this assists in enabling a clean handover from the component model to the alternative model, and vice versa, under the control of the CAVI. Hence, for the purposes of the following discussion, it will be assumed that the alternative models are cycle accurate models.

Through use of the approach illustrated in FIG. 1, the system under verification can be allowed to operate normally until a particular trigger condition is met as indicated by the switch criteria, at which point the relevant alternative model is then switched in in place of the associated component model for a number of subsequent specific verification tests. Whilst the alternative models may take a variety of forms, in one embodiment the alternative models are transactors arranged to perform one or more test actions during which at least one of one or more stimulus signals and one or more response signals are ransferred between a portion of the system under verification and the transactor. Transactors often provide a more direct route to exercising design corner cases, thereby enabling verification closure to be completed more efficiently. However, if such a transactor were merely used in place of a particular component model during the verification process, this can potentially compromise system integrity due to the absence of the actual component model or component models that have been substituted. However, the component models can remain in place for much of the system verification process, and are only switched out for certain specific verification tests where the transactors are more appropriate.

Figure 2:
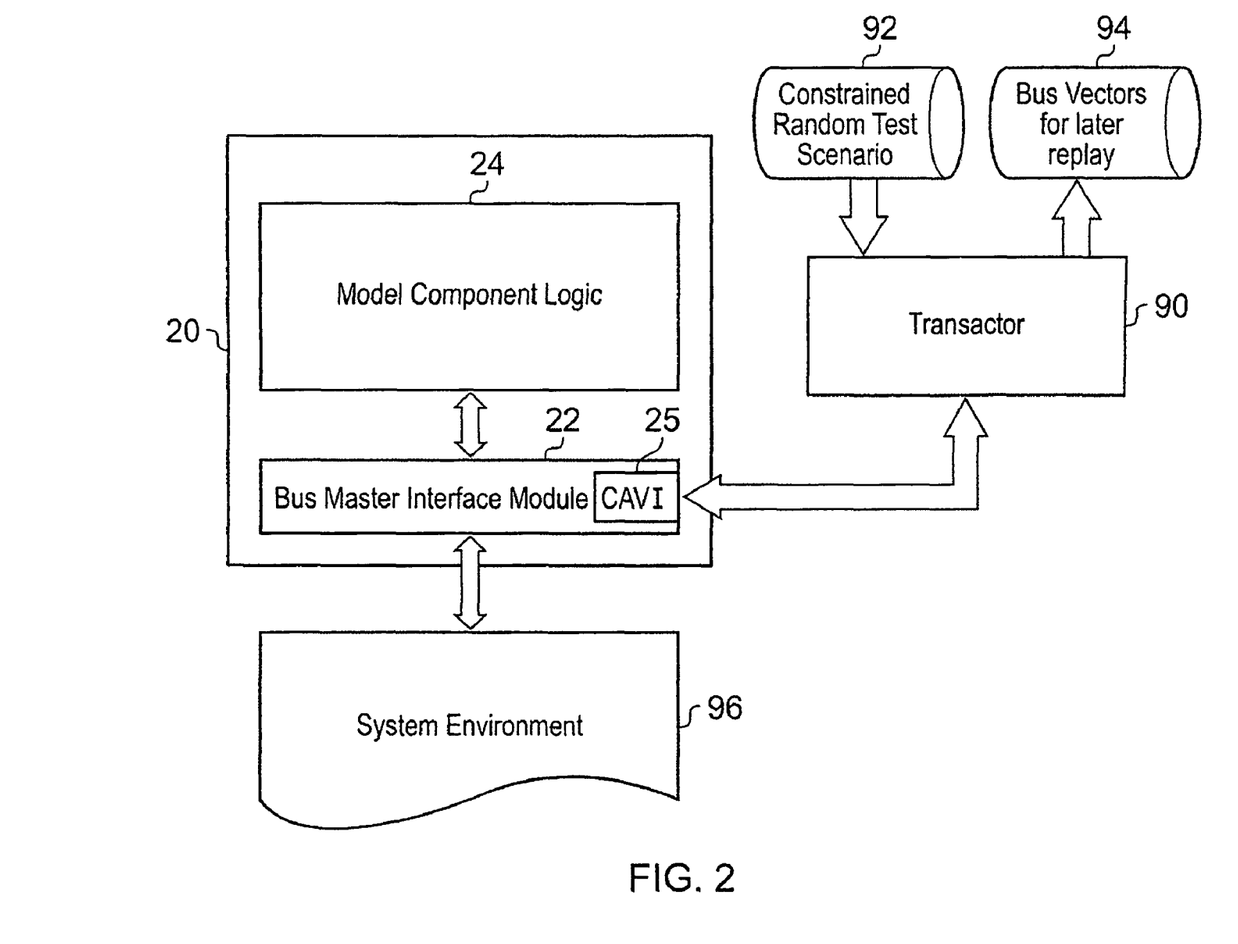
FIG. 2 is a diagram illustrating in more detail the elements of the apparatus of FIG. 1 provided to enable an alternative model to be selectively switched in place of a component model for selected verification tests in accordance with one non-limiting example embodiment.

FIG. 2 is a block diagram illustrating in more detail an alternative model that may be provided in association with a master model component, in this example the master model component 20. As shown in FIG. 2, the master model component 20 includes the bus master interface module 22 as mentioned earlier in FIG. 1, along with the necessary model component logic 24 required to represent the behaviour of the hardware component or hardware components being modelled by the component model 20. The component model 20 is coupled via the bus master interface module 22 with the remainder of the system environment 96, and as discussed earlier a CAVI 25 is implemented as part of the class structure of the bus interface module 22 to allow an alternative model to be coupled as and when required.

The alternative model in this instance is a transactor 90 which is able to perform a constrained random test scenario 92 defining a sequence of test actions to be performed. As will also be described in more detail later, the transactor 90 can cause the CAVI 25 to enter an active-passive state of operation, in which the CAVI 25 effectively snoops the transactions taking place between the component model 20 and the rest of the system environment 96, and provides information about those transactions to the transactor 90, which is stored as bus vectors 94 for later replay by the transactor 90. This functionality enables the transactor 90 to later emulate the behaviour of the component model 20 up to a particular point of interest, whereafter the transactor 90 can then begin to execute some specific test actions, for example some test actions aimed at verifying particular corner cases in the system design.

Whilst the component model 20 provides a cycle accurate model of a particular master component, for example a processor core, the transactor 90 provides a cycle accurate model of a more generic master component, but is externally seen by the rest of the system environment 96 as equivalent to the component model 20, in that it interacts with the rest of the system environment 96 in the same manner with the same interface protocols.

Figure 3:
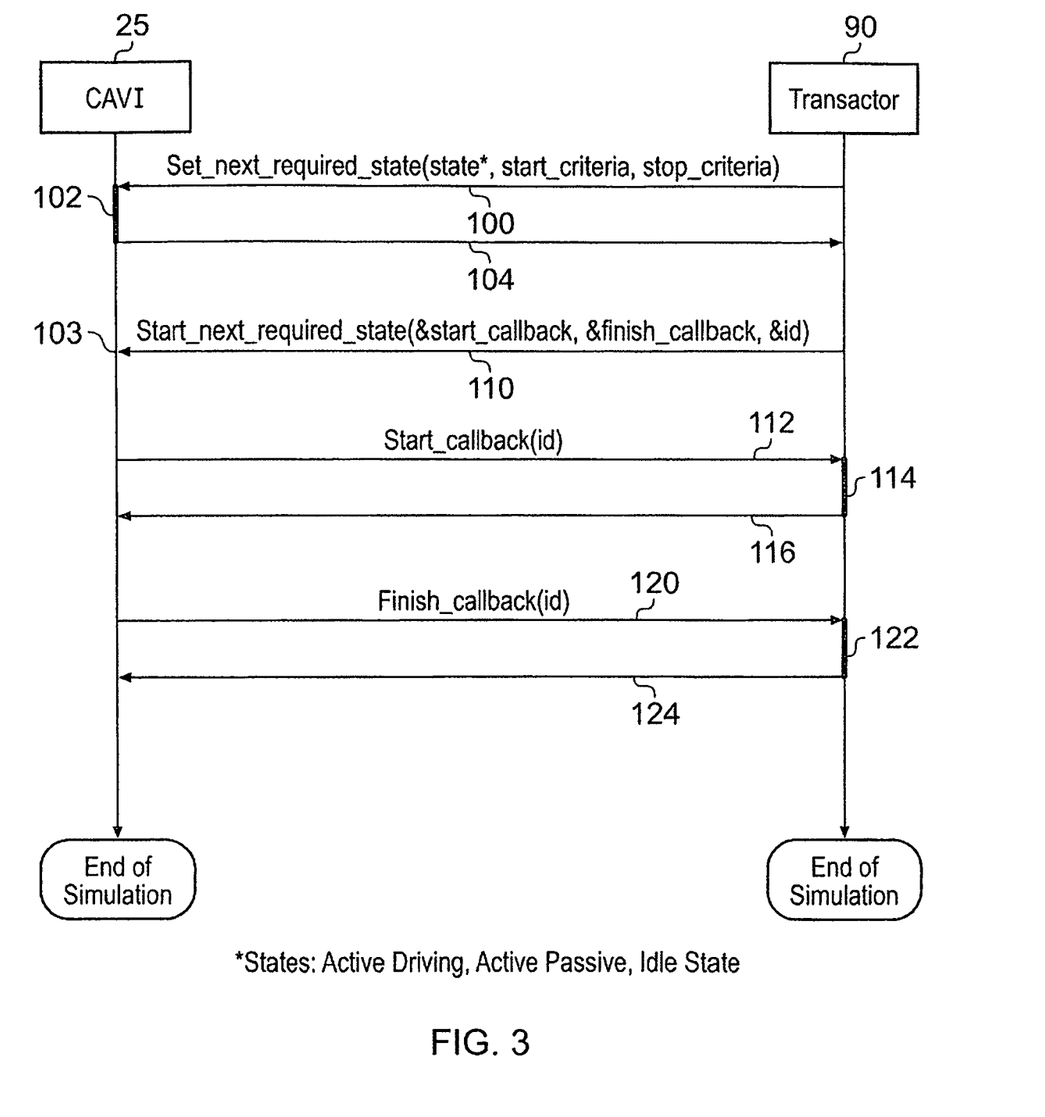
FIG. 3 illustrates various function calls and notifications that may be made between the alternative model and the verification interface module in accordance with one non-limiting, example embodiment.

FIG. 3 illustrates various function calls and notifications that can be made between the transactor 90 and the CAVI 25 of FIG. 2 in order to cause the CAVI to enter a particular state, and then to cause the required actions to take place following defined start criteria. Optionally stop criteria can also be specified to cause such actions to cease. Prior to causing the CAVI to transition from a current state to a next state, the transactor 90 will typically issue a set_next_required_state function call to the CAVI 25, as indicated by the line 100, this function call specifying the next state, the start criteria applicable to that next state, and optionally any stop criteria applicable to that next state. This will cause the CAVI 25 during the period 102 to receive into a buffer the next state parameters specified in the function call, whereafter an acknowledgement signal will be returned over path 104 to the transactor 90.

Subsequently, the transactor 90 will issue a start_next_required_state function call when it wishes the next state to be entered, as indicated by the line 110. This function call indicates an address of a start callback function, an address of a finish callback function and an ID address to be associated with both start callback and finish callback notifications when those notifications are issued by the CAVI 25 to trigger the associated functions within the transactor 90. In contrast to the set_next_required_state function call, the start_next_required_state function call is in this embodiment non-blocking, in that not all actions required in response to that function call need to be implemented immediately by the CAVI 25. Instead, the CAVI will typically, on receipt of the function call passed over path 110 at point 103, replace the current state parameters with the next state parameters that had been buffered during period 102 in order to cause the transition to the next state, and will then monitor the activities occurring over the bus master interface module 22 in order to determine the point at which the start criteria are met, at which point it will issue a start callback notification to the start callback address specified in the start_next_required_state function call, passing as an attribute of that notification the ID value that was given by that function call. This causes the transactor 90 during the period 114 to execute the start callback routine to set itself into the required internal state applicable for the state in which the CAVI 25 has been placed. For example, if the CAVI has been placed into the active driving state, the transactor 90 will typically during the step 114 get itself into a state ready to start initiating transactions via the bus master interface module 22, and hence for example may identify and open one or more files identifying the test actions to be performed. Similarly, if the CAVI has been placed into the active passive state, the transactor 90 may identify and open a file ready to store into that file the monitor data that it will subsequently receive from the CAVI 25 during the active passive mode. Once the start callback routine has been performed by the transactor 90, it will issue an acknowledgement over path 116 to the CAVI 25 to confirm that the transactor 90 is now ready.

A similar sequence will be performed when any stop criteria are met, and in particular on detection of the stop criteria, the CAVI 25 will issue a finish callback notification over path 120 to the finish callback address specified in the earlier start_next_required_state function call. This will cause the transactor 90 to perform some steps during the period 122 to exit its current internal state, whereafter an acknowledgement signal will be returned over path 124.

Figure 4:
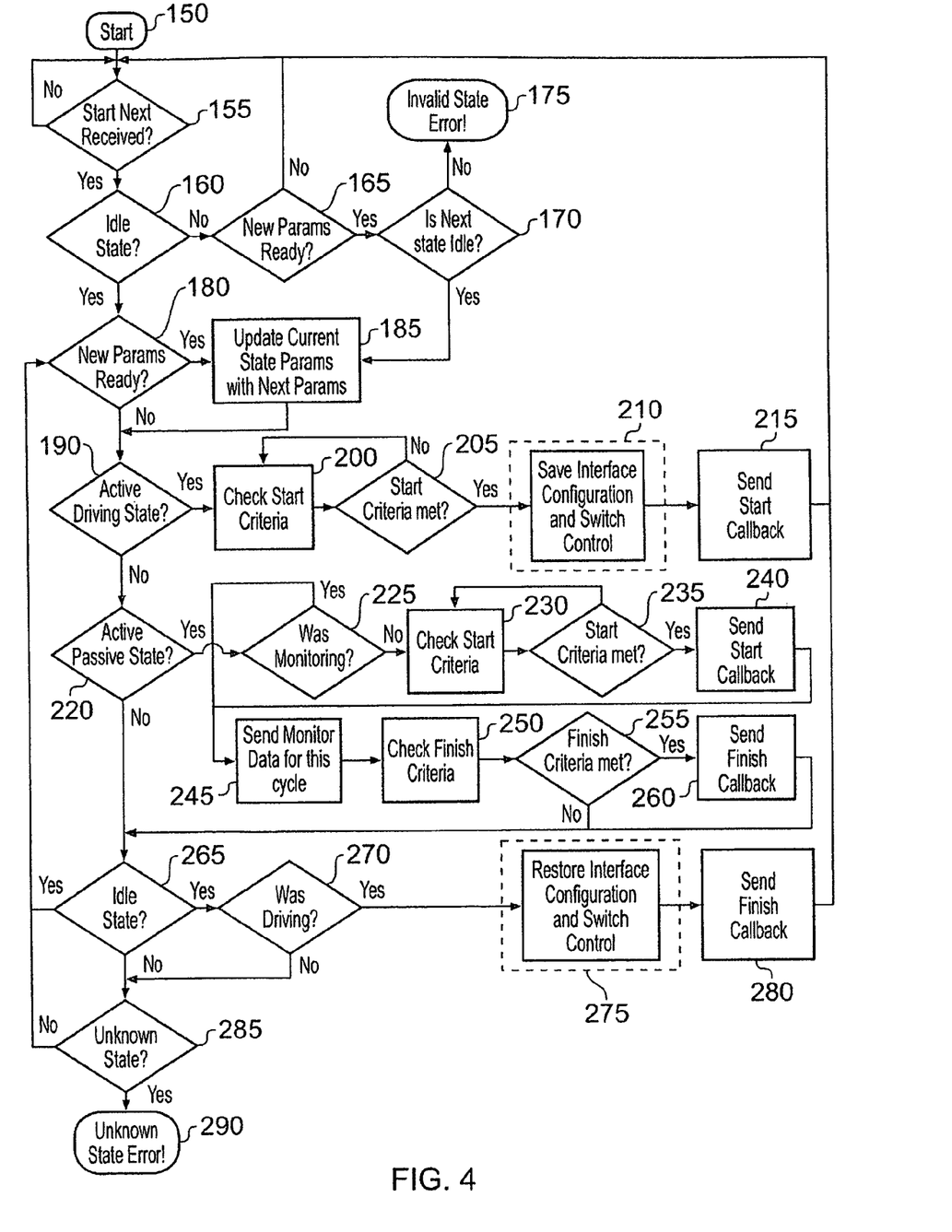
FIG. 4 is a flow diagram illustrating the operation of the verification interface module in accordance with one non-limiting, example embodiment.

FIG. 4 illustrates in more detail the steps performed within the CAVI 25 in accordance with one non-limiting, example embodiment. The process starts at step 150, and then proceeds to step 155 where it is determined whether a start_next_required_state function call (hereafter referred to as a start next function call) has been received. If not, the process waits at step 155 until a start next function call is received, whereafter at step 160 it is then determined whether the current state is an idle state. If it is not an idle state, then it is determined whether the new parameters applicable to the next state are ready at step 165, and if not the process returns to step 155, since it is not possible for the next state to be activated until the parameters are ready.

If at step 165 the new parameters are ready, then it is determined at step 170 whether the next state is an idle state, and if it is not then an invalid state error occurs at step 175. This is because in the described embodiment the active driving state and the active passive state will always be followed by an idle state and hence if it is determined at step 160 that the current state is not an idle state and then determined at step 170 that the next state is also not an idle state, then this violates that protocol.

Assuming at step 170 it is determined that the next state is an idle state, then the process proceeds to step 185 where the state parameters are updated with the next state parameters, whereafter the process proceeds to step 190.

Similarly, if the current state is determined to be an idle state at step 160, and it is determined at step 180 that the new parameters are ready, then again the current state parameters are updated with the next state parameters at step 185, whereafter the process proceeds to step 190.

If at step 190 it is determined that the now current state (i.e. that resulting from the update at step 185) is an active driving state, then at start 200 the start criteria are checked, whereafter at step 205 it is determined whether the start criteria have been met. If not, the process loops back to step 200, but once the start criteria have been met, the process proceeds to block 210, where the interface configuration is saved and control is switched from the component model 20 to the transactor 90. Further details of this particular block of operation will be described later with reference to FIG. 5A. In addition to block 210, the start callback notification is sent from the CAVI 25 to the transactor 90 at step 215 to allow the transactor to then place itself into the appropriate internal state and begin initiating transactions, the process then returning to step 155. For the active driving state, there is no stop criteria specified, and instead the acting driving state is ended by causing the CAVI to enter into the idle state of operation. Accordingly, at some future point, the transactor 90 will determine that it has completed the required transfers and will send a start next function call to the CAVI 25 to cause it to enter the idle state. The processing will then proceed via steps 155, 160, 165, 170 and 185 to cause the parameters for the idle state to be stored, whereafter processing will then proceed via steps 190 and 220 to step 265 where it will be determined that the now current state is an idle state. The process will then proceed to step 270, where in this instance it will determine that it was previously in the active driving state, causing the process to proceed to block 275, where the interface configuration information applicable to the component model will be restored, and control will then be switched back to the component model 20. Further details of the operations performed during block 275 will be described later with reference to FIG. 5B. In addition, at step 280 the finish callback notification is sent from the CAVI 25 to the transactor 90 to cause the transactor to exit its current internal state, whereafter the process returns to step 155.

In addition to the active driving state, the CAVI 25 may also be placed into an active passive state, and if the now current state is an active passive state, this will be detected at step 220, whereafter the process will proceed to step 225 to identify whether the CAVI is already monitoring the activities on the bus master interface module 22, i.e. whether it was already in the previous cycle sending monitor data. If not, the process proceeds to step 230 where the specified start criteria are checked, whereafter it is determined at step 235 whether the start criteria have been met. If not, the process loops back to step 230, but if it has been met, then the start callback notification is sent from the CAVI 25 to the transactor 90 at step 240 whereafter the process proceeds to step 245 following receipt of the acknowledgement from the transactor.

At step 245, monitor data for the current cycle is sent from the CAVI 25 to the transactor 90, such monitor data being indicative of the transactions taking place via the bus master interface module 22. Thereafter, at step 250, the finish criteria are checked, and assuming the finish criteria have not yet been met, then the process branches from step 255 to step 265. Assuming at this point the CAVI is staying in the active passive state, it will be determined at step 265 that the CAVI is not in the idle state, and further will be determined at step 285 that it is not in an unknown state, and as a result the process will branch back to step 180. Assuming the state is not being changed at the current time, there will not typically be new parameters ready at step 180, and accordingly the process will branch back via step 190 to step 220, where it will again be noted that the CAVI is in the active passive state, and the process will proceed to step 225.

At this point, it will be determined that the CAVI was already monitoring data, and accordingly the process will proceed directly to step 245 where the monitor data for this next cycle will then be sent to the transactor 90.

The above process will then continue until at step 255 it is determined that the finish criteria have been met, whereafter the process will proceed to step 260 to cause the finish callback notification to be sent from the CAVI to the transactor. The fact that the finish criteria have been met does not in itself mean that the active passive state of operation is exited. Instead, the process merely loops back to step 265, and assuming the state is not changed, the process will proceed via steps 265, 285, 180, 190 to step 220 where it will again be determined that the CAVI is in the active passive state. At this point it will be determined at step 225 that the CAVI was no longer monitoring because the finish criteria had been met on the previous cycle, and accordingly the process then proceeds to step 230 to check the start criteria, whereafter the process proceeds as discussed above.

Figure 5A:
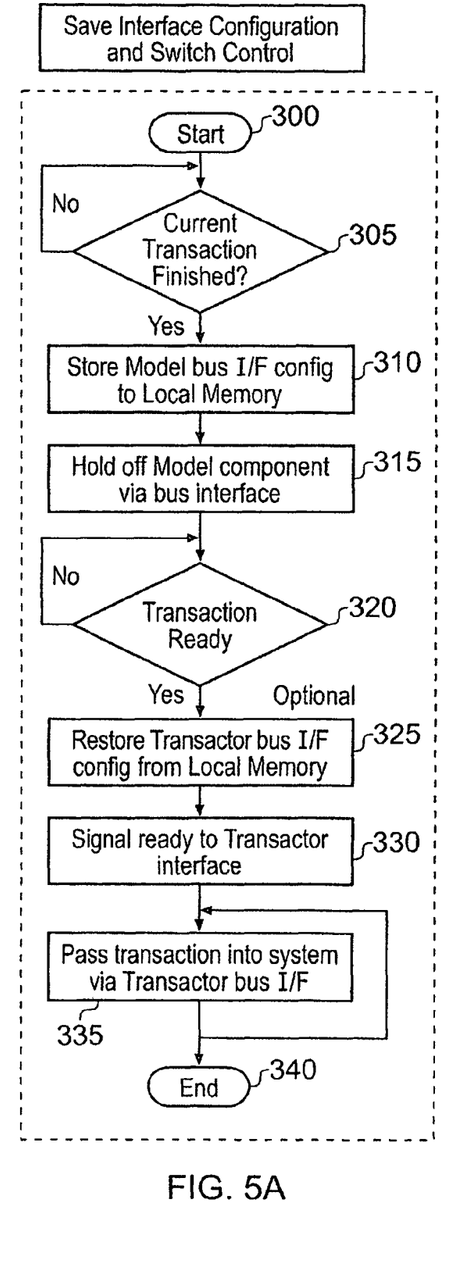
FIGS. 5A and 5B are flow diagrams illustrating in more detail the steps performed at blocks 210 and 275, respectively, of FIG. 4.

FIG. 5A illustrates in more detail the steps performed to implement block 210 of FIG. 4. At step 300, the process starts, whereafter at step 305 it is determined whether the current transaction being performed by the component model 20 has finished. Once the current transaction has finished, the process progresses to step 310, where the bus interface configuration for the component model is stored to local memory provided for the CAVI 25, whereafter the CAVI at step 315 holds off the component model via the bus interface. In particular, the model component logic 24 within the component model 20 will receive a signal that the bus master interface model 22 is not ready to receive a next transaction.

Thereafter, it will be determined at step 320 whether the transactor has a transaction ready to issue to the bus interface module, and once there is a transaction ready, the process proceeds to step 325 where the bus interface configuration applicable to the transactor is restored from local memory. Step 325 is an optional step, and is performed dependent on whether the bus interface configuration applicable to the transactor has previously been stored in local memory of the CAVI 25. In some embodiments, this may not be necessary, since when the transactor is switched in to perform certain tests, there may be no direct correlation with the previous state of the system when the transactor was last switched in. Hence, in one embodiment the bus interface configuration applicable to the transactor may not be stored, and accordingly step 325 would not be required.

Following step 325, or directly following step 320 if step 325 is not implemented, a ready signal is sent to the transactor interface, whereafter a transaction can then be routed into the system environment via the transactor bus interface and the CAVI 25. This process can be repeated a number of times dependent on the tests being performed by the transactor 90, whereafter the process ends at step 340.

It will be appreciated that whilst all of the steps of FIG. 5A have been loosely associated with block 210 in FIG. 4, not all of these steps will be performed prior to sending the start callback notification at step 215. Typically, the start callback notification of step 215 will be issued after step 315 of FIG. 5A, as it is only once the transactor has performed the required start callback operations in response to that start callback notification that it will then be ready to send transactions.

Figure 5B:
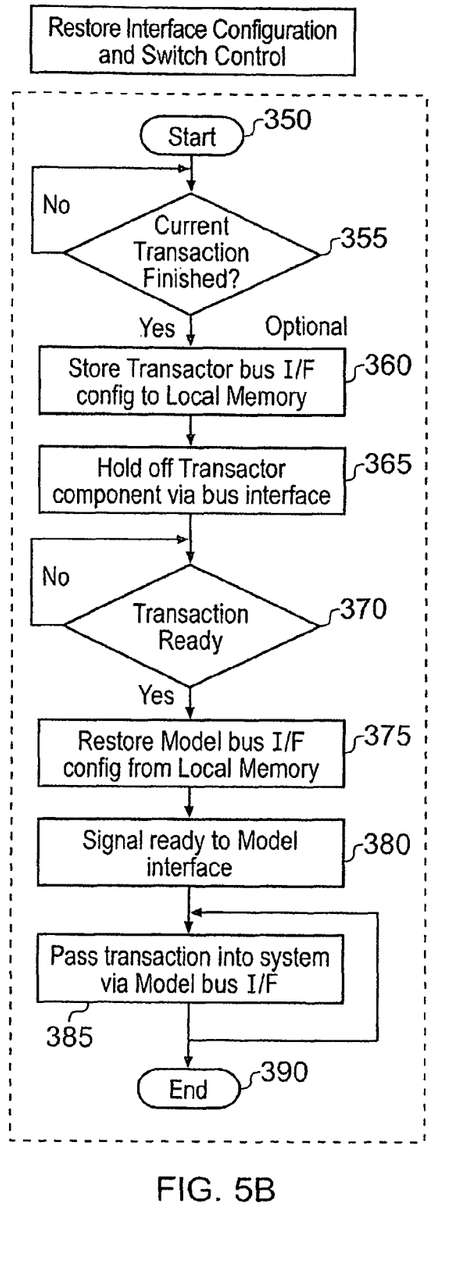

FIG. 5B illustrates the corresponding sequence of steps generally corresponding to block 275 in FIG. 4, to enable the component model 20 to be switched back into the system in place of the transactor 90. It will be appreciated that the steps performed in FIG. 5B generally correspond with the steps performed in FIG. 5A. It is first awaited for the current transaction to be finished at step 355, in this instance this being a transaction being performed by the transactor 90, whereafter the current bus interface configuration information applicable to the transactor is optionally stored at step 360 and then the transactor component is held off via the bus interface as step 365.

When it is then determined at step 370 that the component model has a transaction ready to issue, then at step 375 the bus interface configuration applicable to the component model is restored from local memory, whereafter a signal is sent at step 380 to the component model 20 to indicate that the bus interface is ready. Thereafter, transactions can be passed at step 385 into the system from the component model 20 via the bus interface module 22. Step 385 can be repeated a number of times, until all required transactions have been performed, whereafter the process ends at step 390.

Typically the finish callback notification indicated by step 280 in FIG. 4 will be sent to the transactor at around the time of step 365 in FIG. 5B to cause the transactor to exit its current mode of operation.

Figure 6:
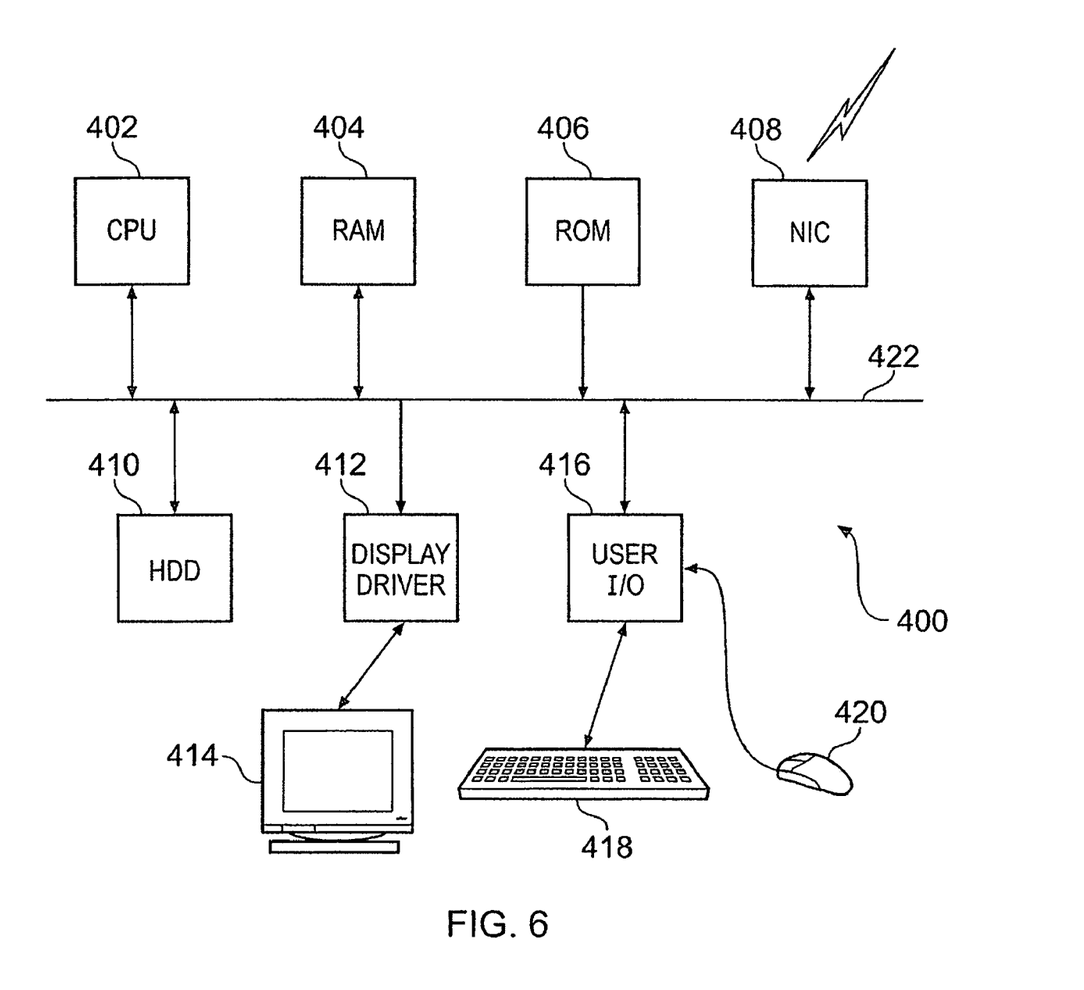
FIG. 6 schematically illustrates a general purpose computer of the type that may be used to implement the techniques of non-limiting, example embodiments.

FIG. 6 schematically illustrates a general purpose computer 400 of the type that may be used to implement the above described techniques. The general purpose computer 400 includes a central processing unit 402, a random access memory 404, a read only memory 406, a network interface card 408, a hard disk drive 410, a display driver 412 and monitor 414, and a user input/output circuit 416 with a keyboard 418 and mouse 420 all connected via a common bus 422. In operation, the central processing unit 402 will execute computer program instructions that may be stored in one or more of the random access memory 404, the read only memory 406 and the hard disk drive 410, or dynamically downloaded via the network interface card 408. The results of the processing performed may be displayed to a user via the display driver 412 and the monitor 414. User inputs for controlling the operation of the general purpose computer 400 may be received via the user input/output circuit 416 from the keyboard 418 or the mouse 420. It will be appreciated that the computer program could be written in a variety of different computer languages. The computer program may be stored and distributed on a recording medium or dynamically downloaded to the general purpose computer 400. When operating under control of an appropriate computer program, the general purpose computer 400 can perform the above described techniques and can be considered to form an apparatus for performing the above described techniques. The architecture of the general purpose computer 400 could vary considerably and FIG. 6 is only one example.

From the above description of non-limiting, example embodiments, it will be seen that such embodiments provide a mechanism which allows the original system components to remain in place whilst verification tests are being conducted, but with one or more alternative models being switched in temporarily as and when required to perform specific verification tests. As an example, a transactor providing a more direct route for exercising design corner cases can be switched in temporarily in place of a particular component model to allow such corner case testing to take place, with the original component model then being switched back into the system. The technique hence allows for normal operation of the system to proceed until a trigger condition is met, whereafter the verification transactor is then allowed to take control of the simulation for a particular sequence of tests. The verification transactor can be switched in and out of simulation as many times as required.

Typically the component model and associated alternative model will be provided at the same level of abstraction, and in one particular embodiment both models are provided at a cycle accurate level of abstraction.

Through use of the active passive state of operation, a vector capture mode can be implemented where the alternative model is provided with monitor data indicating the current activities of the component model which it can then store for later replay, therefore allowing the alternative model to emulate the behaviour of the component model up to a particular point of interest, whereafter the alternative model can then perform some further specific test actions.

Indeed it should be noted that through use of the above vector capture mode, this allows later exact system reproduction using the alternative model, without requiring the component model with which it is associated to be present at all. To ensure data integrity of the vectors stored within the alternative model in this manner, the CAVI can perform a check sum operation on vectors that are snooped in order for it to be able to be later confirmed that they have been generated using the vector capture functionality.

Through use of the techniques of non-limiting, example embodiments, unobtrusive operation in the modelling environment can be achieved with no significant overhead in the final implementation, since testing is performed at the cycle accurate model level.

In accordance with non-limiting, example embodiments, transactions created by the alternative model and routed via the CAVI interface do not modify the state of the host component model in which the CAVI interface is provided. Further, the transactions generated by the alternative model are not treated any differently by any other component in the system under verification, and accordingly the use of the alternative model is transparent to the system under verification. It should be noted that in typical embodiments its use is also transparent to the component model with which the alternative model is associated, since the model component logic is merely stalled whilst the alternative model is being used, the model component logic waiting for a ready signal from its interface before it can continue its operation.

Although particular non-limiting, example embodiments have been described herein, it will be appreciated that the claims are not limited thereto and that many modifications and additions thereto may be made within the scope of the claims.

We claim:

1. An apparatus for performing a sequence of verification tests to verify a design of a data processing system, the apparatus comprising:
a system under verification representing the design of the data processing system, the system under verification including a component model representing at least one hardware component of the data processing system, the component model including an interface module through which the component model interacts with other portions of the system under verification during performance of the verification tests;

an alternative model for representing the hardware component for selected verification tests; and the interface module comprising a verification interface module which is responsive to switch criteria specified by the alternative model to switch in the alternative model in place of the component model, such that the alternative model takes the place of the component model during performance of the selected verification tests.

2. An apparatus as claimed in claim 1, wherein at least the component model of the system under verification is a cycle accurate model, and the switch criteria are timing dependent.

3. An apparatus as claimed in claim 2, wherein the alternative model is also a cycle accurate model.

4. An apparatus as claimed in claim 1, wherein the verification interface module is provided with local memory, on occurrence of the switch criteria the verification interface module awaiting completion of any current transaction involving the component model, and then saving interface configuration information of the interface module to the local memory prior to switching in the alternative model in place of the component model.

5. An apparatus as claimed in claim 4, wherein the verification interface module is further responsive to switch back criteria to await completion of any current transaction involving the alternative model, and then to reference the interface configuration information in the local memory in order to restore the interface module to its configuration that existed prior to the alternative model having being switched in, whereafter the component model is allowed to resume interacting with the other portions of the system under verification.

6. An apparatus as claimed in claim 1, wherein the alternative model is a transactor for performing one or more test actions transferring at least one of one or more stimulus signals and one or more response signals between a portion of the system under verification and said transactor during performance of said selected verification tests.

7. An apparatus as claimed in claim 1, wherein the selected verification tests are verification tests aimed at exercising corner cases in the system under verification.

8. An apparatus as claimed in claim 1, wherein the verification interface module has a plurality of states of operation, and is responsive to one or more predetermined events to transition from a current state of operation to a next state of operation.

9. An apparatus as claimed in claim 8, wherein one of said one or more predetermined events is receipt by the verification interface module of a state change command from the alternative model identifying the next state of operation.

10. An apparatus as claimed in claim 8, wherein one of said states of operation is an active driving state, when in the active driving state the verification interface module being responsive to occurrence of the switch criteria to switch in the alternative model in place of the component model.

11. An apparatus as claimed in claim 8, wherein one of said states of operation is an active passive state, when in the active passive state the verification interface module being responsive to monitor criteria specified by the alternative model to monitor certain transactions occurring between the component model and the other portions of the system under verification via the interface module, and to send monitor data indicative of those transactions to the alternative model.

12. An apparatus as claimed in claim 11, wherein the alternative model is arranged to store the monitor data to allow later replay of the monitored transactions by the alternative model when the verification interface module subsequently switches in the alternative model in place of the component model.

13. An apparatus as claimed in claim 11, wherein the alternative model is arranged to analyse the monitor data to seek to identify occurrence of one or more specific transaction activities.

14. An apparatus as claimed in claim 8, wherein the alternative model is arranged to issue a parameter update command to the verification interface module to alter parameters specifying criteria to be applied by the verification interface module either in its current state of operation or when the verification interface module has transitioned to said next state of operation.

15. An apparatus as claimed in claim 8, wherein the transition from the current state to the next state is performed via a handshake mechanism between the verification interface module and the alternative model.

16. An apparatus as claimed in claim 1, further comprising one or more further alternative models for representing the hardware component, each of which is coupled to the verification interface module, separate switch criteria being specified for each further alternative model.

17. A method of operating a computer simulator to perform a sequence of verification tests to verify a design of a data processing system, the method comprising the steps of:

providing to the computer simulator a system under verification representing the design of the data processing system, the system under verification including a component model representing at least one hardware component of the data processing system;

providing within the component model an interface module through which the component model interacts with other portions of the system under verification during performance of the verification tests;

providing to the computer simulator an alternative model for representing the hardware component for selected verification tests;

responsive to switch criteria specified by the alternative model, the computer simulator employs a verification interface module within the interface module to switch in the alternative model in place of the component model, such that the alternative model takes the place of the component model during performance of the selected verification tests.

18. A simulator tool for executing on a computer to perform a sequence of verification tests to verify a design of a data processing system, the simulator tool performing the steps of:

providing a system under verification representing the design of the data processing system, the system under verification including a component model representing at least one hardware component of the data processing system;

providing within the component model an interface module through which the component model interacts with other portions of the system under verification during performance of the verification tests;

providing an alternative model for representing the hardware component for selected verification tests;

responsive to switch criteria specified by the alternative model, employing a verification interface module within the interface module to switch in the alternative model in place of the component model, such that the alternative model takes the place of the component model during performance of the selected verification tests.

* * * * *